United States Patent
Kuo et al.

(10) Patent No.: US 11,705,502 B2
(45) Date of Patent: Jul. 18, 2023

(54) METHOD FOR LATERALLY ETCHING GATE SPACERS

(71) Applicant: Taiwan Semiconductor Manufacturing Co., Ltd., Hsinchu (TW)

(72) Inventors: Chun-Yu Kuo, Hsinchu (TW); Shang-Yun Huang, Hsinchu County (TW); Chih-Yin Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/937,389

(22) Filed: Jul. 23, 2020

(65) Prior Publication Data

US 2021/0234021 A1    Jul. 29, 2021

Related U.S. Application Data

(60) Provisional application No. 62/966,867, filed on Jan. 28, 2020.

(51) Int. Cl.
*H01L 29/66* (2006.01)
*H01L 29/423* (2006.01)
(Continued)

(52) U.S. Cl.
CPC .. *H01L 29/66545* (2013.01); *H01L 21/28114* (2013.01); *H01L 21/823456* (2013.01); *H01L 21/823468* (2013.01); *H01L 29/42376* (2013.01); *H01L 29/6653* (2013.01); *H01L 29/6656* (2013.01); *H01L 29/66795* (2013.01);
(Continued)

(58) Field of Classification Search
CPC .......... H01L 29/66545; H01L 29/6653; H01L 29/6656; H01L 29/66553; H01L 29/42376; H01L 29/42384; H01L 29/7856; H01L 21/28114; H01L 21/823456; H01L 21/82385; H01L 21/31111; H01L 21/31116; H01L 21/823468; H01L 21/823864; H01L 21/823437; H01L 21/823828; H01L 21/823431; H01L 21/823821; H01L 21/845; H01L 27/0886; H01L 27/0924; H01L 27/1211; H01L 27/10826; H01L 27/10879; H01L 29/41971; H01L 29/66795–66818; H01L 29/785–7856; H01L 2029/7857–7858; H01L 2924/13067; H01L 29/78696;
(Continued)

(56) References Cited

U.S. PATENT DOCUMENTS 9,093,467 B1 * 7/2015 Xie .................. H01L 21/32133
9,287,403 B1 * 3/2016 Lee .................... H01L 29/6653
(Continued)

*Primary Examiner* — Younes Boulghassoul
(74) *Attorney, Agent, or Firm* — Sterne, Kessler, Goldstein & Fox P.L.L.C.

(57) ABSTRACT

The present disclosure relates to a semiconductor device including a substrate and a pair of spacers on the substrate. Each spacer of the pair of spacers includes an upper portion having a first width and a lower portion under the upper portion and having a second width different from the first width. The semiconductor device further includes a gate structure between the pair of spacers. The gate structure has an upper gate length and a lower gate length that is different from the upper gate length.

20 Claims, 9 Drawing Sheets

(51) Int. Cl.
*H01L 21/8234* (2006.01)
*H01L 21/28* (2006.01)
*H01L 21/311* (2006.01)
*H01L 29/78* (2006.01)

(52) U.S. Cl.
CPC ....... *H01L 29/785* (2013.01); *H01L 21/31111* (2013.01); *H01L 21/31116* (2013.01)

(58) Field of Classification Search
CPC .......... H01L 29/72392; H01L 29/0673; H01L 29/66439; H01L 29/775
See application file for complete search history.

(56) References Cited

U.S. PATENT DOCUMENTS

| | | | |
|---|---|---|---|
| 9,660,050 B1* | 5/2017 | Cai | H01L 21/28141 |
| 10,388,747 B1* | 8/2019 | Xie | H01L 29/6653 |
| 2002/0119647 A1* | 8/2002 | Riley | H01L 21/31111 |
| | | | 438/595 |
| 2011/0127589 A1* | 6/2011 | Chen | H01L 21/28026 |
| | | | 257/288 |
| 2012/0049247 A1* | 3/2012 | Lee | H01L 21/28114 |
| | | | 257/288 |
| 2013/0049142 A1* | 2/2013 | Liu | H01L 29/4983 |
| | | | 257/E21.409 |
| 2015/0041905 A1* | 2/2015 | Xie | H01L 29/517 |
| | | | 257/369 |
| 2016/0225877 A1* | 8/2016 | Wang | H01L 21/823437 |
| 2019/0311900 A1* | 10/2019 | Pandit | H01J 37/32357 |
| 2020/0287019 A1* | 9/2020 | Mulfinger | H01L 29/66553 |
| 2021/0035857 A1* | 2/2021 | Zhou | H01L 21/31116 |
| 2021/0074829 A1* | 3/2021 | Tang | H01L 29/7851 |

* cited by examiner

METHOD FOR LATERALLY ETCHING GATE SPACERS

This application claims the benefit of U.S. Provisional Patent Application No. 62/966,867, titled "Laterally Etched Spacers for Semiconductor Device," which was filed on Jan. 28, 2020 and is incorporated herein by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
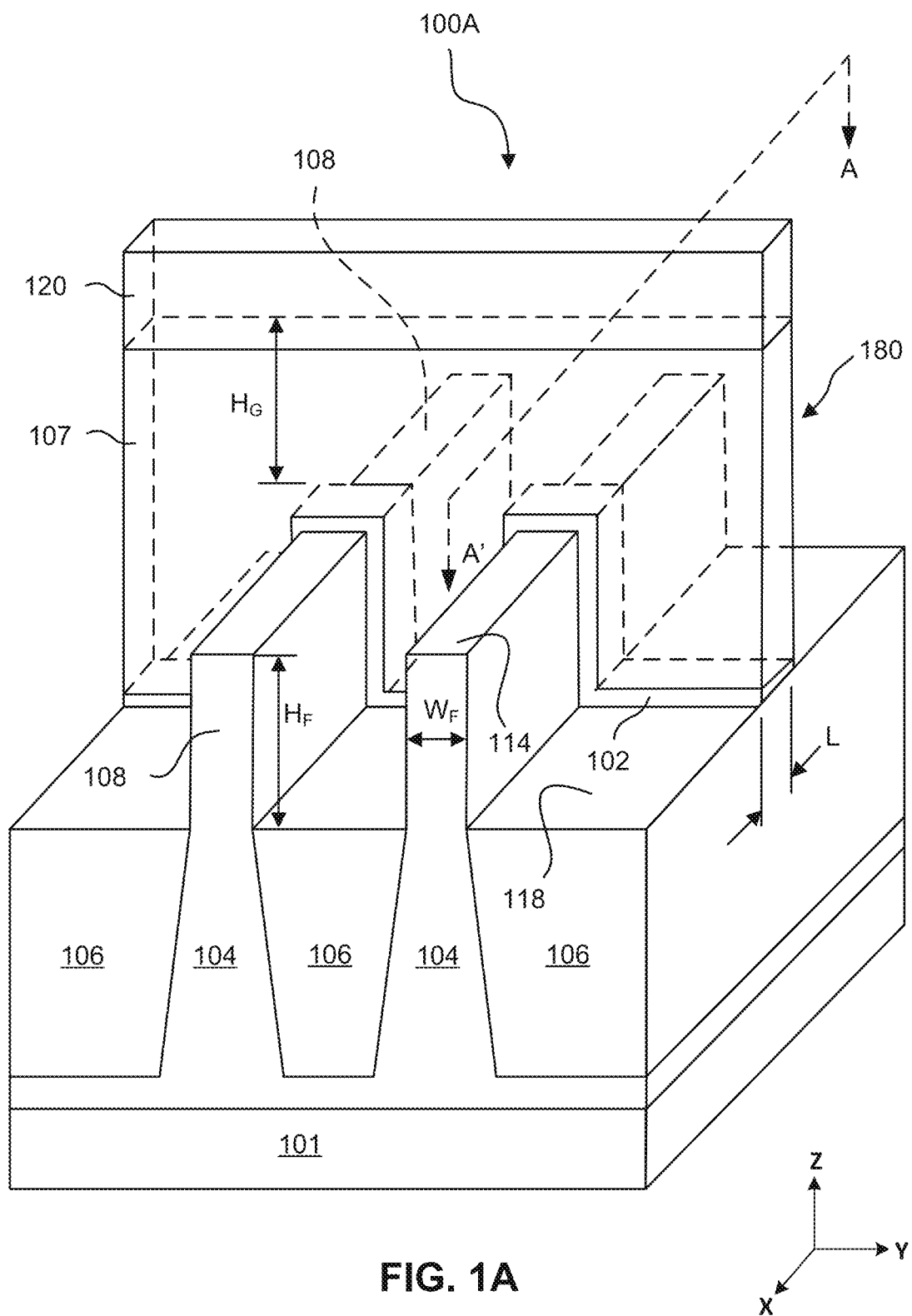
FIGS. 1A and 1B are cross-sectional views of semiconductor devices, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value).

The terms "vertical direction" and "horizontal direction" respectively refer to z-direction and x-direction as illustrated in the figures herein.

As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device that is a three-dimensional FET that includes the formation of a fin-like channel extending from the substrate. FinFETs are compatible with conventional complementary metal-oxide-semiconductor (CMOS) processes and their three-dimensional structure allows them to be aggressively scaled while maintaining gate control and mitigating short channel effects. Gate stacks are used in planar and three-dimensional FETs for controlling the conductivity of the semiconductor device. A gate stack including a gate dielectric layer and a gate electrode for a finFET device can be formed by a replacement gate process where a polysilicon sacrificial gate structure is replaced by a metal gate structure. Gate dielectric layers, such as a high-k dielectric layer (e.g., a dielectric layer having dielectric constant greater than about 3.9), is formed between the channel and the gate electrode. Spacers can be disposed on sidewalls of the gate stack to protect the gate structures during fabrication processes, such as ion implantation, gate replacement process, epitaxial source/drain structure formation, and other suitable processes.

Various embodiments in accordance with this disclosure provide methods for forming laterally etched spacers for gate structures of transistor devices. In some embodiments, the transistor devices can be finFETs, negative capacitance FETs (NCFETs), nano sheet devices, nano wire devices, and/or other suitable devices. The spacers can be formed by etching back a polysilicon sacrificial gate structure and laterally etching the exposed portions of the spacers. The sacrificial gate structure is removed and replaced by a metal gate electrode. The laterally etched spacers can include an upper portion having a first width and a lower portion having a second width that is greater than the first width. The gate electrode formed between opposing laterally etched spacers can have variable width, such as a wider upper portion that is in physical contact with subsequently formed gate contacts and a narrower lower portion that is formed over a channel region of the transistor device. Increasing the gate electrode's upper width and decreasing its lower width can provide benefits of, among others, (i) increased gate contact area which in turn can improve metal filling uniformity and increase alignment tolerance; and (ii) reduced gate capacitance between gate electrode and the underlying channel region which in turn increases device speed.

FIG. 1A is an isometric view of a semiconductor structure 100A, in accordance with some embodiments of the present disclosure. Semiconductor structure 100A includes Fin-FETs. For example, semiconductor structure 100A includes a substrate 101, a plurality of fins 104, a plurality of isolation structures 106, and a gate structure 180. Gate structure 180 is disposed over sidewalls and a top surface of each of fins 104. Fins 104 and isolation structures 106 have top surfaces 114 and 118, respectively. Gate structure 180 includes a gate dielectric layer 102 and a gate electrode 107. In some embodiments, one or more additional layers or structures can be included in gate structure 180.

FIG. 1A shows a hard mask 120 disposed on a top surface of gate electrode 107. Hard mask 120 is used to pattern, such as by etching, gate structure 180. In some embodiments, hard mask 120 includes a dielectric material, such as silicon nitride. The isometric view of FIG. 1A is taken after the patterning process (e.g., etching) of a gate dielectric layer 102 and a gate electrode 107 to form gate structure 180. Integrated circuits can include a plurality of such, and similar, gate structures.

Each of the plurality of fins 104 includes a pair of source/drain (S/D) terminals S/D 108. S/D 108 are formed in, on, and/or surrounding fins 104. A channel region of fins 104 underlies gate structure 180. In some embodiments, S/Ds 108 are formed in substrate 101 for planar devices. Gate structure 180 has a gate length L and a gate width ($2 \times H_F + W_F$), as shown in FIG. 1A. In some embodiments, the gate length L is in a range from about 10 nm to about 30 nm. In some embodiments, the gate length L is in a range from about 3 nm to about 10 nm. In some embodiments, the fin width $W_F$ is in a range from about 6 nm to about 12 nm. In some embodiments, the fin width $W_F$ is in a range from about 4 nm to about 6 nm. Gate height $H_G$ of gate structure 180, measured from a fin top surface 114 to the top of gate structure 180, is in a range from about 50 nm to about 80 nm, in some embodiments. Fin height $H_F$ of fin 104, measured from the isolation structure top surface 118 to fin top surface 114, is in a range from about 5 nm to about 100 nm.

Substrate 101 can be a silicon substrate, according to some embodiments. In some embodiments, substrate 101 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including SiGe; or (iv) combinations thereof. In some embodiments, substrate 101 can be a silicon on insulator (SOI). In some embodiments, substrate 101 can be an epitaxial material.

Fins 104 are active regions where one or more transistors are formed. Fins 104 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP and/or indium antimonide; (iii) an alloy semiconductor including SiGe; or (iv) combinations thereof. Fins 104 can be fabricated using suitable processes, including patterning and etch processes. The patterning process can include forming a photoresist layer over the substrate 101 (e.g., on a silicon layer), exposing the photoresist to a pattern, performing post-exposure bake processes, and developing the photoresist to form a masking element including the resist. The masking element can then be used to protect regions of the substrate 101 while an etch process forms recesses into substrate 101, leaving protruding fins 104. The recesses can be etched using a reactive ion etch (RIE) and/or other suitable processes. Numerous other methods to form fins 104 on substrate 101 can be suitable. For example, fins 104 can include epitaxial material, in accordance with some embodiments.

Isolation structures 106 can partially fill the recesses and can include a dielectric material such as, for example, silicon oxide, spin-on-glass, silicon nitride, silicon oxynitride, fluorine-doped silicate glass (FSG), a low-k dielectric material, other suitable insulating material, and/or combinations thereof. In some embodiments, isolation structures 106 can be shallow trench isolation (STI) structures and can be formed by etching trenches in substrate 101. The trenches can be filled with insulating material, followed by a chemical-mechanical polishing (CMP) and etch-back process. Other fabrication techniques for isolation structures 106 and/or fins 104 are possible. Isolation structures 106 can include a multi-layer structure such as, for example, a structure with one or more liner layers. Isolation structures 106 can also be formed by depositing an enhanced gap fill layer using the multi-step deposition and treatment process to eliminate voids and seams in the gap fill material.

Gate structure 180 can include a gate dielectric layer 102, a gate electrode 107, and/or one or more additional layers, according to some embodiments. In some embodiments, gate structure 180 uses polysilicon as gate electrode 107.

Although gate structure 180 is described as using polysilicon or amorphous silicon for gate electrode 107, gate structure 180 can be a sacrificial gate structure, such as a gate structure 180 formed in a replacement gate process for a metal gate structure. The metal gate structure can include barrier layer(s), gate dielectric layer(s), work function layer(s), fill metal layer(s), and/or other suitable materials for a metal gate structure. In some embodiments, the metal gate structure can include capping layers, etch stop layers, and/or other suitable materials.

Exemplary p-type work function metals that can be included in the metal gate structure are TiN, tantalum nitride (TaN), ruthenium (Ru), molybdenum (Mo), aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), other suitable p-type work function materials, or combinations thereof. Exemplary n-type work function metals that can be included in the metal gate structure are Al, titanium (Ti), silver (Ag), tantalum aluminum (TaAl), tantalum aluminum carbon (TaAlC), tantalum aluminum nitride (TaAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer. Thus, the material of a work function layer can be chosen to tune its work function so that a desired threshold voltage $V_{th}$ is achieved by a device formed in the respective region. The work function layer(s) can be deposited by chemical vapor deposition (CVD), plasma-enhanced CVD (PECVD), atomic layer deposition (ALD), other suitable processes, and/or combinations thereof.

A fill metal layer can be deposited over the work function metal layer(s). The fill metal layer fills in remaining portions of trenches or openings formed by removal of the sacrificial gate structure. The fill metal layer can include Al, W, copper (Cu), and/or other suitable materials. The fill metal can be formed by ALD, CVD, physical vapor deposition (PVD), plating, other suitable processes, and/or combinations thereof.

Semiconductor device structure 100A described above includes fins 104 and gate structure 180. The semiconductor device structure 100A can include multiple gate structures 108 formed over fins 104. The semiconductor device structure 100A can include additional processing to form various features such as, for example, lightly-doped-drain (LDD) regions and doped S/D structures. The term "LDD region" is used to describe lightly-doped regions disposed between a channel region of a transistor and at least one of the transistor's S/D regions. LDD regions can be formed in fins 104 by doping. Ion implantation can be used, for example, for the doping process. Other processes can be used for doping the LDD regions.

Figure 1B:
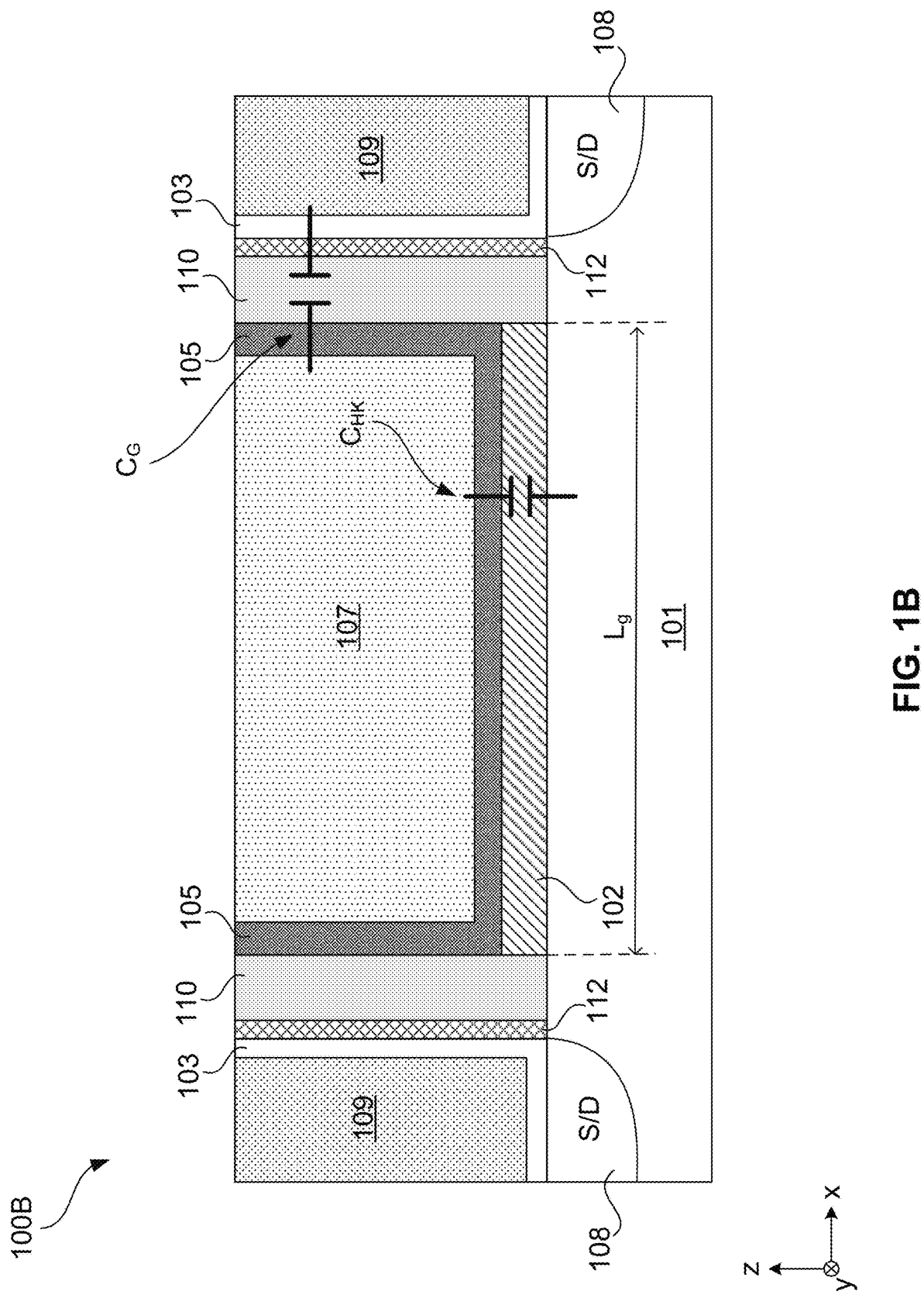

FIG. 1B shows a cross-sectional view of a semiconductor device 100B, in accordance with some embodiments. In some embodiments, semiconductor device 100B can be a vertical FET device. Semiconductor device 100B of FIG. 1B can be an illustration of semiconductor device 100A as viewed from the plane A-A' of FIG. 1A during a fabrication operation. FIG. 1B shows semiconductor device 100B formed on substrate 101. In some embodiments, substrate 101 can include a fin structure such as fins 104 illustrated in FIG. 1A. Therefore, structures of semiconductor device 100B, such as gate dielectric layer 102 and spacers 110 and 112, are formed on fin 104. Semiconductor device 100B can be formed using a replacement gate process. Replacement metal gates are used in scaled finFET-based devices for improved circuit performance. For example, metal gate electrodes can replace polysilicon gate electrodes to achieve reduced gate leakage and improved drive current. One process of implementing metal gates is termed a "gate last" or "replacement gate" process. Such processes include forming a sacrificial polysilicon gate, performing various processes associated with the semiconductor device, removing the sacrificial gate to form a trench or opening, and depositing metal gate material in the trench or opening to form a metal gate.

As shown in FIG. 1B, a gate stack is formed between opposing sidewall surfaces of ILD 109 and a top surface of semiconductor substrate 101. In some embodiments, semiconductor substrate 101 can be a fin of a vertical transistor device. In FIG. 1B, work function layer 105 and a gate electrode 107 are collectively referred to herein as "a metal gate stack" and is positioned over a semiconductor substrate 101. Spacer 110 is formed on sidewalls of the metal gate stack and gate dielectric layer 102 to facilitate a subsequent source/drain alignment operation. As shown in FIG. 1B, gate dielectric layer 102 and work function layer 105 are lined between semiconductor substrate 101 and gate electrode 107. Work function layer 105 is formed between spacer 110 and gate electrode 107. In some embodiments, in addition to the layers described above, semiconductor device 100B may further include isolation layers, liner layers, seed layers, adhesion layers, barrier layers, work function layers, or their equivalents—which are not illustrated in FIG. 1B for simplicity purposes.

Gate electrode 107 and substrate 101 can form a high-k capacitor using high-k gate dielectric 102 and work function layer 105 as a capacitor dielectric. Gate length $L_g$ is a distance between a pair of source/drain (S/D) 108. S/D 108 can be doped with p-type or n-type dopants and is not described in detail herein for simplicity. By adjusting gate electrode length $L_g$, capacitance of high-k capacitor $C_{HK}$ can be adjusted. As the capacitance of high-k capacitor $C_{HK}$ is proportional to gate electrode length $L_g$, reducing gate electrode length $L_g$ can reduce the capacitance of high-k capacitor $C_{HK}$ which in turn improves the speed of semiconductor device 100. However, reducing gate electrode length $L_g$ can also lead to challenges during the gate replacement process for forming gate electrode 107. For example, depositing metal becomes increasingly difficult when length $L_g$ is reduced and voids may be present in the formed gate electrode 107. In some embodiments, the gate length $L_g$ of semiconductor device 100A can be about 16 nm. In some embodiments, gate length $L_g$ can be less than about 16 nm. In some embodiments, gate length Lg can be greater than about 16 nm. In some embodiments, gate length $L_g$ can be dependent upon the technology node. For example, gate length $L_g$ can be about 7 nm or about 5 nm.

Semiconductor substrate 101 can be a bulk semiconductor substrate on which various layers and device structure are formed. In some embodiments, semiconductor substrate 101 can include silicon or a compound semiconductor, such as gallium arsenide (GaAs), indium phosphide (InP), silicon germanium (SiGe), silicon carbide (SiC), other suitable semiconductor materials, and combinations thereof. In some embodiments, various layers can be formed on semiconductor substrate 101, such as dielectric layers, doped layers, polysilicon layers, conductive layers, other suitable layers, and combinations thereof. In some embodiments, various devices can be formed on semiconductor substrate 101, such as transistors, resistors, capacitors, other suitable devices, and combinations thereof. In some embodiments, semiconductor substrate 101 can be a fin of a vertical transistor device. In some embodiments, semiconductor substrate 101 can be a device layer containing other suitable devices.

ILD 109 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 109 can include a high density plasma (HDP) dielectric material (e.g., HDP oxide) and/or a high aspect ratio process (HARP) dielectric material (e.g., HARP oxide). ILD 109 can also include one or more dielectric materials and/or one or more dielectric layers. One or more planarization process can be used to planarize the top surface of ILD 109. During a gate replacement process, ILD 109 can be planarized by a chemical mechanical polishing (CMP) process until a top portion of a polysilicon gate is exposed. After the polysilicon gate is replaced with a metal gate, such as gate electrode 107, another CMP process can be performed to planarize the top surfaces of the gate electrode 107, spacers, 110, and ILD 109. The CMP process includes a high selectivity to provide a substantially planar surface for the metal gate stack, spacers 110, and ILD 109. In some embodiments, the CMP process has low dishing and/or metal erosion effect. In some embodiments, ILD 109 formed above S/D 108 can be replaced with metal S/D contacts.

Liner layer 103 can be formed between ILD 109 and S/D 108. In some embodiments, liner layer 103 can also be formed on sidewalls of ILD 109. Liner layer 103 can be a barrier layer formed using any suitable dielectric material.

Spacers 110 and 112 can be formed between opposing surfaces of ILD 109 and on surface of substrate 101. Spacers 110 and 112 can include a plurality of sub-spacers that are not illustrated in FIG. 1A for simplicity. In some embodiments, spacers 110 can be formed using silicon nitride. Spacers 112 can be formed using a dielectric material different from that of spacers 110. In some embodiments, spacers 110 and 112 can be formed using any suitable dielectric material, such as silicon oxide, silicon oxynitride, any other suitable dielectric material, and/or combinations thereof. Spacers 110 and 112 can be formed by blanket depositing a dielectric material and anisotropically etching the dielectric material such that the remaining dielectric material is formed on sidewalls of ILD 109 or liner layer 103.

Gate dielectric layer 102 can be formed on a top surface of substrate 101, in accordance with some embodiments. Gate dielectric layer 102 can include a dielectric material having dielectric constant greater than about 3.9. In some embodiments, gate dielectric layer 102 can include hafnium oxide. In some embodiments, gate dielectric layer 102 can be in a crystalline form. Gate dielectric layer 102 can be formed by chemical oxidation, thermal oxidation, atomic layer deposition (ALD), chemical vapor deposition (CVD), physical vapor deposition (PVD), any other suitable deposition methods, and/or combinations thereof. In some embodiments, the high-k dielectric layer can be formed using amorphous material.

Work function layer 105 can be used to adjust the threshold voltage $V_{th}$ of semiconductor device 100B. In some embodiments, work function layer 105 can include aluminum, copper, tungsten, titanium, tantalum, titanium nitride, tantalum nitride, nickel silicide, cobalt silicide, silver, tantalum carbide, tantalum silicon nitride, tantalum carbon nitride, titanium aluminum, titanium aluminum nitride, tungsten nitride, metal alloys, and/or combinations thereof. In some embodiments, work function layer 105 can include Al-doped metal, such as Al-doped Ti, Al-doped TiN, Al-doped Ta, or Al-doped TaN. Work function layer 105 can be formed using a suitable deposition process, such as ALD, CVD, PVD, plating, and combinations thereof. In some embodiments, work function layer 105 can have a thickness ranging from about 2 nm to about 15 nm. For example, the thickness of work function layer 105 can be between about 2 nm and about 6 nm, between about 6 nm and about 10 nm, between about 10 nm and about 15 nm. Other materials, formation methods and thicknesses for work function layers 105 are within the scope and spirit of this disclosure.

Gate electrode 107 can be formed on work function layer 105 and between opposing spacers 110. Gate electrode 107 can be formed of tungsten, copper, titanium, silver, aluminum, titanium aluminide, titanium aluminide nitride, tantalum carbide, tantalum carbide nitride, tantalum silicide nitride, manganese, cobalt, palladium, nickel, rhenium, platinum, titanium nitride, tungsten nitride, tantalum nitride, any suitable conductive material, and/or combinations thereof. In some embodiments, gate electrode 107 can be formed of metal alloys, such as titanium aluminum alloy, rhenium tantalum alloy, rhenium zirconium alloy, platinum titatnium alloy, cobalt nickel alloy, tungsten nitride alloy, titanium nitride alloy, molybdenum nitride alloy, tantalum nitride alloy, tantalum silicon nitride alloy, any suitable metal alloys, and combinations thereof. In some embodiments, gate electrode 107 can be formed using a damascene process followed by a planarization process (e.g., a CMP process) to remove any excessive material formed on the top surface of ILD 109. In some embodiments, ILD 109 is removed and a metal S/D contact is formed in place of the removed ILD 109. A capacitor $C_G$ can be formed between gate electrode 107 and the metal S/D contact. Spacers 110 and 112 are used as capacitor dielectric for capacitor $C_G$, and the capacitance of capacitor $C_G$ is inversely proportional to the total widths (dimension measured in the x direction) of spacers 110 and 112. For example, decreasing the widths of spacers 110 and 112 can lead to an increase of the capacitance of capacitor $C_G$.

As gate length $L_g$ is scaled down through various technology nodes to increase device density, high-k capacitance $C_{HK}$ is reduced. A reduced gate length $L_g$ can lead to challenges for the replacement gate process during which a metal gate electrode is deposited between opposing spacers 110. Defects, such as voids, can be formed in gate electrode 107 that reduces device performance and may lead to device failure.

Figure 2:
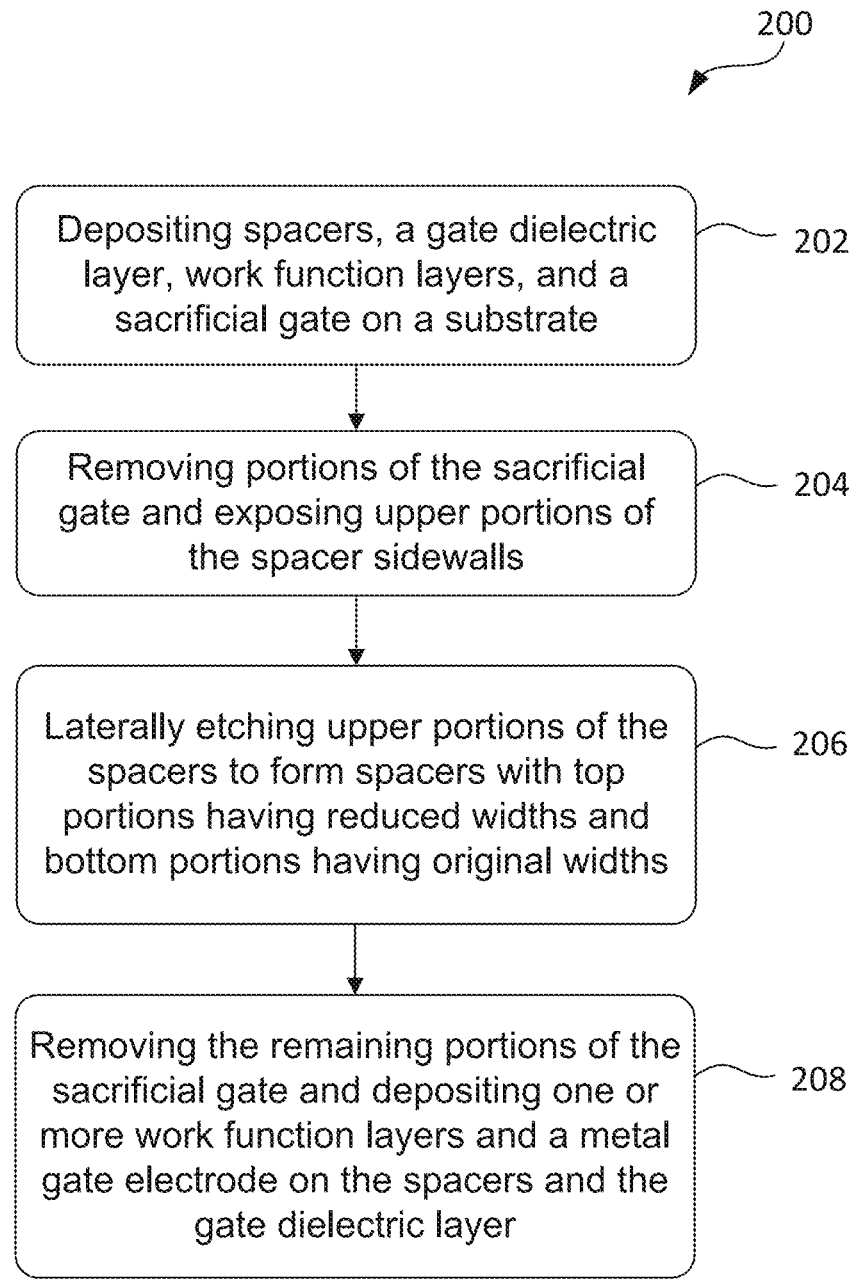
FIG. 2 is a flow diagram of a method for forming laterally etched spacers of a semiconductor device, in accordance with some embodiments.

FIG. 2 is a flow diagram of a method 200 for forming laterally etched spacers in semiconductor devices during a gate replacement process, in accordance with some embodiments of the present disclosure. The operations of method 200 can be performed in a different order and/or vary, and method 200 may include additional operations that are not described for simplicity. FIGS. 3-6 are cross-sectional views of fabricating an exemplary semiconductor structure 300 incorporating laterally etched spacers. FIGS. 3-6 are provided as exemplary cross-sectional views to facilitate in the explanation of method 200. The semiconductor structures illustrated in FIGS. 7 and 8 can also be formed using method 200 described in FIG. 2. Semiconductor structures illustrated in FIGS. 3-8 can include substrate 101, liner layer 103, S/D 108, ILD 109, and spacers 112, as described above in FIG. 1B. These structures are not described in detail here for simplicity. Although fabrication processes of planar devices and/or finFET are described here as examples, the fabrication process can be applied in various semiconductor structures, such as trenches or gaps, multi-fin finFETs, and any other suitable semiconductor structure. The fabrication processes provided here are exemplary, and alternative processes in accordance with this disclosure may be performed that are not shown in these figures.

Figure 3:
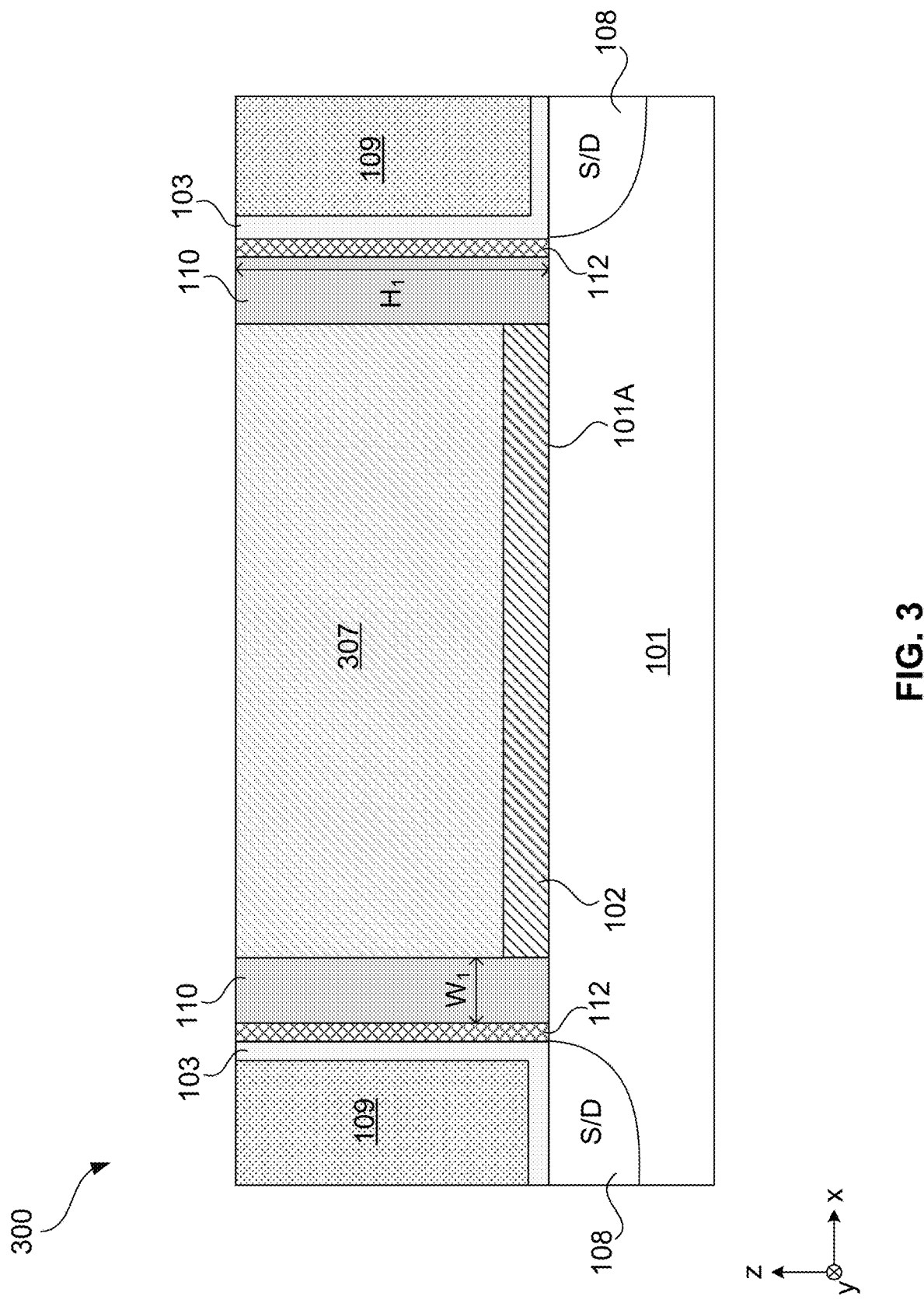
FIGS. 3-6 are cross-sectional views of semiconductor structures incorporating laterally etched spacers, in accordance with some embodiments.

Referring to FIG. 2, at operation 202, spacers 110, a gate dielectric layer 102, work function layers 105, and a sacrificial gate 307 are deposited on a substrate 101, in accordance with some embodiments of the present disclosure. Referring to FIG. 3, gate dielectric layer 102 and a sacrificial gate 307 are formed between opposing sidewalls of spacers 110 and on top surface 101A of substrate 101. Gate dielectric layer 102 can be formed over a channel region of semiconductor device 300. Gate dielectric layer 102 can be of dielectric material having dielectric constant greater than about 3.9. For example, gate dielectric layer 102 can be formed of a hafnium-based oxide material, such as hafnium dioxide. In some embodiments, gate dielectric layer 102 can be formed using oxygen-deficient hafnium oxide. In some embodiments, gate dielectric layer 102 can have a thickness T between about 10 Å and about 30 Å. For example, thickness T can be between about 10 Å and about 20 Å, between about 20 Å and about 30 Å, or any suitable thickness range depending on device design. Gate dielectric layer 102 can be formed by any suitable process, such as CVD, MOCVD, PVD, PECVD, PEALD, thermal oxidation, any other suitable deposition techniques, and combinations thereof. In some embodiments, the deposition processes can be performed in one or more suitable chambers of a semiconductor wafer processing cluster tool.

Spacers 110 are disposed on substrate 101 and along sidewalls of spacers 112. In some embodiments, spacers 110 are disposed directly on liner layer 103 or directly on ILD 109. Spacers 110 can have width $W_1$ measured along the x direction and between about 5 nm and about 10 nm. For example, width $W_1$ can be between about 5 nm and about 7 nm, between about 7 nm and about 10 nm, or any suitable dimensions. Spacers 110 can have height $H_1$ measured along the z direction and between about 20 nm and about 400 nm. For example, height $H_1$ can be between about 20 nm and about 50 nm, between about 50 nm and about 100 nm, between about 100 nm and about 200 nm, between about 200 nm and about 400 nm, or any suitable dimension.

A sacrificial gate 307 is disposed on gate dielectric layer 102 and in physical contact with sidewalls of spacers 110. Sacrificial gate 307 is deposited as a part of the gate replacement process during which sacrificial gate 307 is removed and replaced by a metal gate electrode. Sacrificial gate 307 can be formed by a material that is different from that of spacers 110 to establish high etch selectivity between sacrificial gate 307 and spacers 110. In some embodiments, sacrificial gate 307 can be formed using polycrystalline silicon and spacers 110 can be formed using silicon nitride. In some embodiments, a greater width $W_1$ of spacer 110 can prevent a metal gate electrode from penetrating through spacers 110 in a gate replacement process, during which sacrificial gate 307 is removed and replaced by the metal gate electrode.

Figure 4:
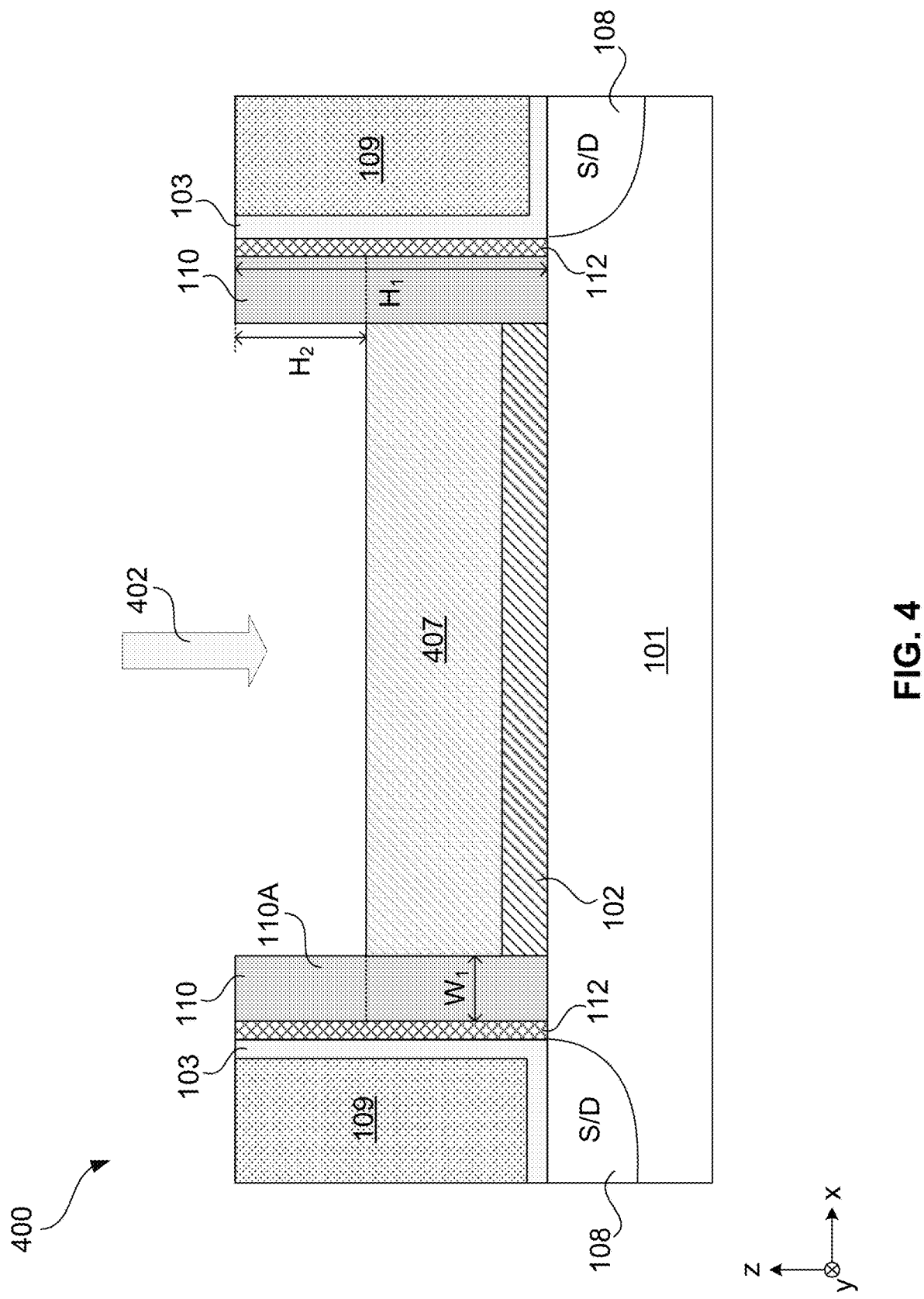

Referring to FIG. 2, at operation 204, portions of the sacrificial gate are removed to partially expose sidewalls of the spacers by exposing upper portions of the spacer sidewalls, in accordance with some embodiments of the present disclosure. Referring to FIG. 4, an etching process 402 is performed on semiconductor device 400 to etch back sacrificial gate 307 and formed etched-back sacrificial gate 407. Etching process 402 can be an anisotropic etching process substantially along the vertical direction (e.g., z direction). A blocking layer (not illustrated in FIG. 4) can be used to protect ILD 109, liner layer 103, and spacers 110 and 112 during etching process 402. Portions of sacrificial gate 307 exposed and not protected by the blocking layer are removed along the vertical direction (e.g., z direction) by suitable etching processes. Etching process 402 can continue until sacrificial gate 307 is etched back by a nominal height $H_2$ to partially expose sidewalls of spacers 110. In some embodiments, height $H_2$ can be between about 5 nm and about 200 nm. In some embodiments, height $H_2$ can be between about 5 nm and about 20 nm, between about 20 nm and about 50 nm, between about 50 nm and about 100 nm, between about 100 nm and about 200 nm, or any suitable dimensions. In some embodiments, a height ratio of height $H_2$ over height $H_1$ of spacers 110 can be between about 0.30 and about 0.5. In other words, between about 30% and about 50% of the sidewalls of spacer 110 can be exposed. In some embodiments, the height ratio can be between about 0.3 and about 0.35, between about 0.35 and about 0.42, between about 0.42 and about 0.5, or any suitable dimensions. A greater height ratio of $H_2$ over $H_1$ (e.g., a greater proportion of the sidewalls of spacer 110 being exposed) can provide the benefits of, among other things, improved metal filling capability in the opening between opposing spacers 110 as a wider opening can lead to lower probability of void formation in the subsequently formed gate electrode. However, a greater height ratio of $H_2$ over $H_1$ can also lead to a higher $C_G$ capacitance (e.g., the capacitance between subsequently formed gate electrode and S/D metal contacts) that may result in inferior device performance. A lower height ratio of $H_2$ over $H_1$, on the other hand, can provide benefits of a lower $C_G$ capacitance but could lead to challenges in uniformly filling the opening between opposing spacers 110 with a conductive material. Therefore, the height ratio of $H_2$ over $H_1$ can be determined based on device needs, and the nominal height ratio is determined based on a trade-off between higher metal filling capability and lower capacitance. For example, a semiconductor device of which a higher metal filling capability is desirable can have a greater height ratio of $H_2$ over $H_1$. As sacrificial gate 307 is etched back to form etched-back sacrificial gate 407, sidewalls of upper portions 110A of spacers 110 is exposed. Etching process 402 can include any suitable etching processes. For example, a wet chemical etching process can be performed. The wet chemical process can be a timed process until nominal height $H_2$ is achieved. In some embodiments, the wet chemical etch can use etchants such as potassium hydroxide, tetramethylammonium hydroxide (TMAH), any suitable etchants, and combinations thereof. In some embodiments, the wet chemical etch can be performed at room temperature. In some embodiments, the wet chemical etch can be performed at an elevated temperature to facilitate chemical reaction. For example, the etching temperature can be between about 40° C. and about 150° C. In some embodiments, the etching temperature can be between about 40° C. and about 60° C.

Figure 5:
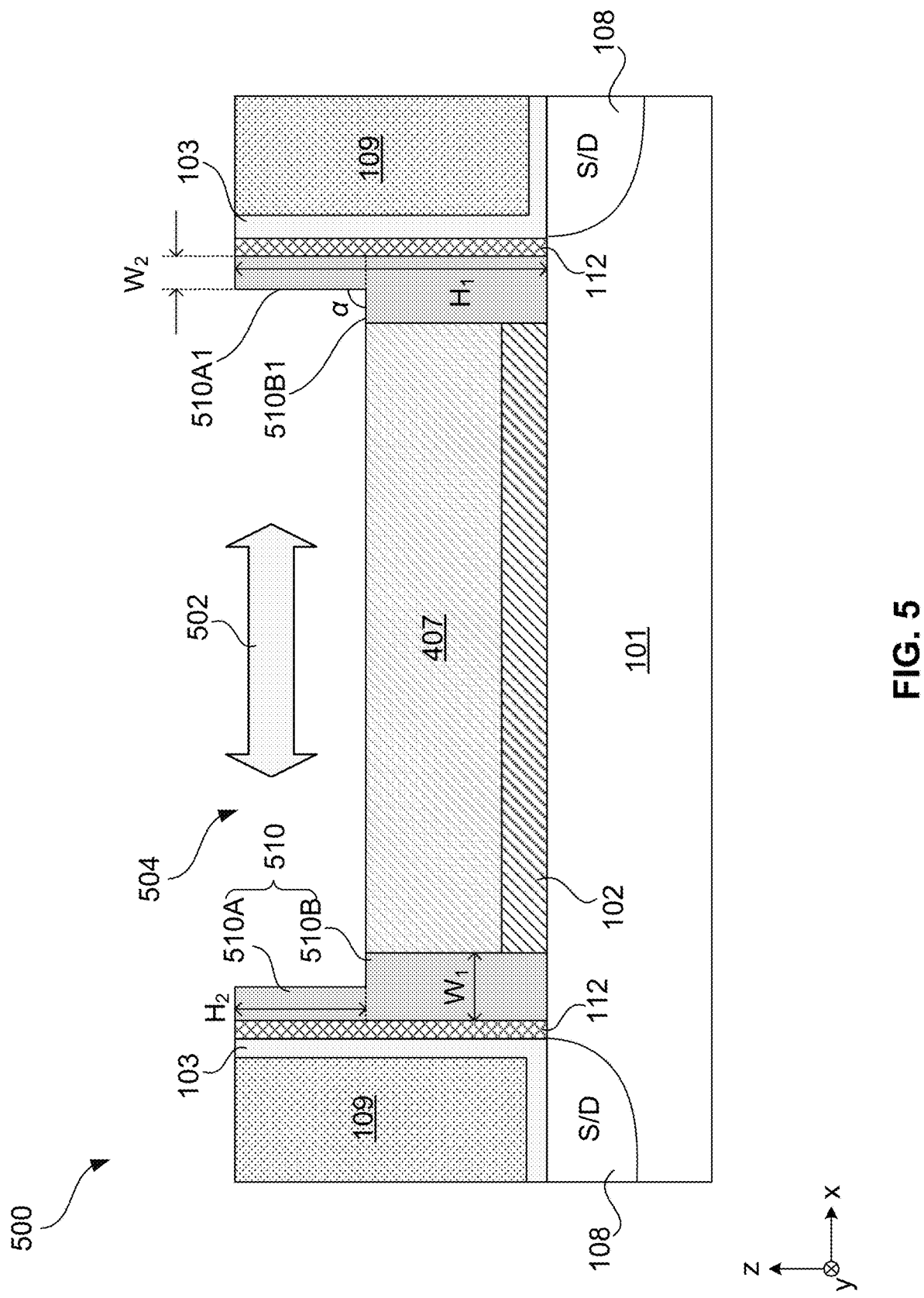

Referring to FIG. 2, at operation 206, upper portions 110A of spacers 110 are laterally etched to form spacers with upper portions having reduced widths and lower portions having original widths, in accordance with some embodiments of the present disclosure. Referring to FIG. 5, a substantially laterally etching process 502 is performed to laterally etch exposed upper portions of spacers 110. Etching process 502 can be an etching process that primarily etch in the lateral direction (e.g., x direction). Upper portions 110A of spacers 110 exposed by the etching back of sacrificial gate 307 is laterally etched back by etching process 502. The lateral etching process 502 can form a spacer with dual widths. For example, spacers 110 are etched back by etching process 502 to form spacers 510 having upper portion 510A and lower portion 510B. Width $W_2$ of upper portion 510A can be less than width $W_1$ of lower portion 510B. In some embodiments, width $W_2$ is between about 70% and about 95% of width $W_1$. For example, width $W_2$ can be between about 70% and about 75%, between about 75% and about 85%, between about 85% and about 95% of width $W_1$. In some embodiments, width $W_1$ of lower portion 510B can maintain its original dimension of spacers 510 due to the physical protection of etched back sacrificial gate 407 during etching process 502. In some embodiments, width $W_1$ can be between about 5 nm and about 10 nm. In some embodiments, width $W_2$ can be between about 3 nm and about 7 nm. For example, width $W_2$ can be between about 3 nm and about 3.5 nm, between about 3.5 nm and about 5.5 nm, between about 5.5 nm and about 7 nm. As shown in FIG. 5, an opening 504 is formed between opposing upper portions 510A of spacers 510 after etching process 502. In some embodiments, a lower width $W_2$ of upper portions 510A can result in opening 504 having a greater width that in turn can prevent voids to be formed in subsequently deposited metal gate electrode. In some embodiments, an electrical short can occur between a metal gate electrode that is formed in opening 504 and a S/D region that is formed by replacing ILD 109 by a conductive material. In some embodiments, upper portion 510A shall have sufficient width to prevent such electric short. For example, width $W_2$ can be greater than about 3 nm. In some embodiments, width $W_2$ can be about 3 nm, about 5 nm, about 7 nm, and any suitable dimensions. In some embodiments, a total width of $W_2$ and the width of spacer 112 can be between about 5 nm and about 10 nm to prevent such electric short.

Upper portion 510A of spacers 510 can have a substantially vertical (e.g., along the z direction) sidewall 510A1 and lower portion 510B of spacers 510 can have a substantially horizontal (e.g., along the x direction) top surface 510B1. Therefore, an angle α between sidewall 510A1 of upper portion 510A and top surface 510B1 of lower portion 510B can be about 90°. In some embodiments, the angle α can be an obtuse angle. For example, angle α can be greater than about 90° and less than about 120°. In some embodiments, angle α can be between about 90° and about 100°, between about 100° and about 110°, between about 110° and about 120°, or any suitable angle. A greater value of angle α can reduce the likelihood of voids forming at the corner between sidewall 510A1 of upper portion 510A and top surface 510B1 of lower portion 510B.

Etching process 502 can be any suitable etching process that provides high etching selectivity between spacers 510 and etched-back sacrificial gate 407. For example, the etching selectivity can be greater than about 10. In some embodiments, etching process 502 can etch substantially in the horizontal (e.g., x direction) such that height $H_2$ is not affected by etching process 502.

In some embodiments, etching process 502 can be a wet chemical etching process using suitable etchants. For example, etching process 502 can use a hydrofluoric acid based etchant, such as hydrofluoric acid. In some embodiments, etching process 502 can use SC1 (mixture of deionized water, ammonium hydroxide, hydrogen dioxide), buffered oxide etch, any suitable wet etchants, and/or combinations thereof. In some embodiments, the wet chemical etching process can be performed at room temperature. In some embodiments, the wet chemical etching process can be performed at an elevated temperature to increase chemical reactions. For example, the wet chemical etching process can be performed at a temperature between about 40° C. and about 60° C.

In some embodiments, etching process 502 can be a dry etching process. The dry etching process can be performed in an etching chamber with active plasma. For example, etching process 502 can be a plasma etching process utilizing hydrofluoric precursors. In some embodiments, etching process 502 can be performed without the activation of plasma. For example, etching process 502 can be an etching process that utilizes absorption reaction rather than plasma activation. For example, the etching process can include hydrogen fluoride and ammonium hydroxide mixed at a suitable ratio. In some embodiments, the mixing ratio can be about 1:1, about 1:2, about 1:3, or any suitable ratios. In some embodiments, etching process 502 can include carbon tetrafluoride precursors. In some embodiments, the etching process can also include inert gas. In some embodiments, a chamber pressure of etching process 502 can be between about 20 mTorr and about 4000 mTorr. For example, the chamber pressure can be between about 20 mTorr and about 100 mTorr, between about 100 mTorr and about 1000 mTorr, between about 1000 mTorr and about 2000 mTorr, between about 2000 mTorr and about 4000 mTorr, or any suitable pressure. In some embodiments, a flow rate of precursors can be between about 10 sccm and about 1000 sccm. For example, the flow rate can be between about 10 sccm and about 100 sccm, between about 100 sccm and about 300 sccm, between about 300 sccm and about 600 sccm, between about 600 sccm and about 1000 sccm, or any suitable flow rate. In some embodiments, the etching process can be performed at a temperature between about room temperature and about 150° C. For example, the temperature can be between about room temperature and about 80° C., between about 80° C. and about 110° C., between about 110° C. and about 150° C., or any suitable temperature. In some embodiments, reducing spacer loss during the etching process can be achieved by adjusting processing parameters of etching process 502. For example, reducing processing temperature, increasing chamber pressure, and/or increasing precursor flow rate, among other things, can reduce spacer loss during the etching process.

Figure 6:
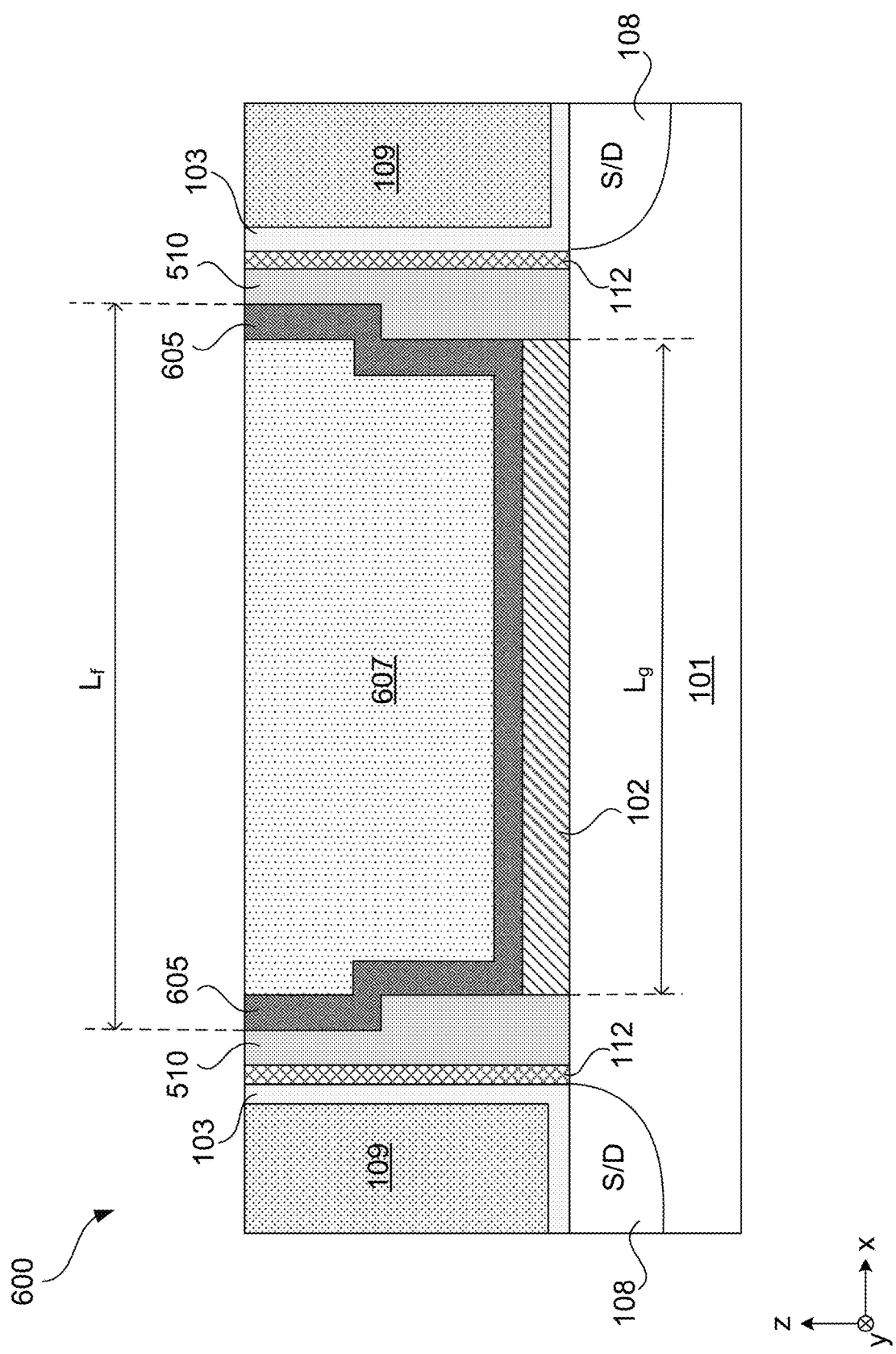

Referring to FIG. 2, at operation 208, the remaining portions of the sacrificial gate is removed and one or more work function layers and a metal gate electrode are deposited on the spacers and the gate dielectric layer, in accordance with some embodiments of the present disclosure. Referring to FIG. 6, an etching process can be used to remove etched-back sacrificial gate 407, and work function layer 605 is disposed on spacers 510 and on gate dielectric layer 102. In some embodiments, work function layer 605 is in physical contact with the sidewall and top surfaces of spacers 510. In some embodiments, the composition and deposition method for forming work function layer 605 can be similar to those of work function layer 105 described above in FIG. 1B. In some embodiments, work function layer 605 is optional. Other layers such as barrier layers can be deposited between work function layer 605 or on work function layer 605 and are not described here for simplicity.

Gate electrode 607 can be deposited on work function layer 605. Gate electrode 607 can include tungsten, WN, TaN, ruthenium, silver, aluminum, any other suitable material, and/or combinations thereof. Gate electrode 607 can be formed using a damascene process followed by a planarization process to remove any excessive material deposited. An example of the planarization process is a CMP process. In some embodiments, the planarization process can also reduce the height of ILD 109, line layer 103, spacers 112 and 510, and work function layer 605. The planarization process can continue until top surfaces of ILD 109, line layer 103, spacers 112 and 510, and work function layer 605 are substantially coplanar. In some embodiments, work function layer 605 is optional. Gate electrode 607 can be directly deposited onto gate dielectric layer 102 and in physical contact with spacers 510 that have been laterally etched back.

Work function layer 605 and gate electrode 607 can be collectively referred to as a gate stack. As the gate stack is deposited between opposing laterally etched spacers 510, therefore, work function layer 605 and gate electrode 607 can contour the shapes of laterally etched spacers 510. Therefore, the gate stack that includes gate electrode 607 and work function layer 605 can have an upper gate length $L_f$ measured between opposing sidewalls of the upper portions of opposing spacers 510 that is greater than lower gate length $L_g$. In some embodiments, a ratio between upper gate length $L_f$ and lower gate length $L_g$ can be between about 1.05 and about 1.3. In some embodiments, the ratio can be between about 1.05 and about 1.15, between about 1.15 and about 1.2, between about 1.2 and about 1.3, or any suitable ratios. A gate electrode 607 having dual gate lengths can provide various benefits. For example, increasing upper gate length $L_f$ can provide the benefits of, among other things, improved metal fill uniformity of gate electrode 607 such that the likelihood of forming voids within gate electrode 607 can be reduced. Increasing upper gate length $L_f$ can also provide greater aligning tolerance of subsequently formed gate vias (not shown in FIG. 6) that are physically and electrically connected to a top surface of gate electrode 607. In some embodiments, increasing upper gate length $L_f$ can also reduce contact resistance by increasing the contact area between the gate vias and gate electrode 607. Reducing lower gate length $L_g$ can reduce the capacitance of high-k capacitor $C_{HK}$. As the capacitance of high-k capacitor $C_{HK}$ is proportional to lower gate electrode length $L_g$, reducing lower gate electrode length $L_g$ can reduce the capacitance of high-k capacitor $C_{HK}$ that in turn improves the speed of semiconductor device 600.

Figure 7:
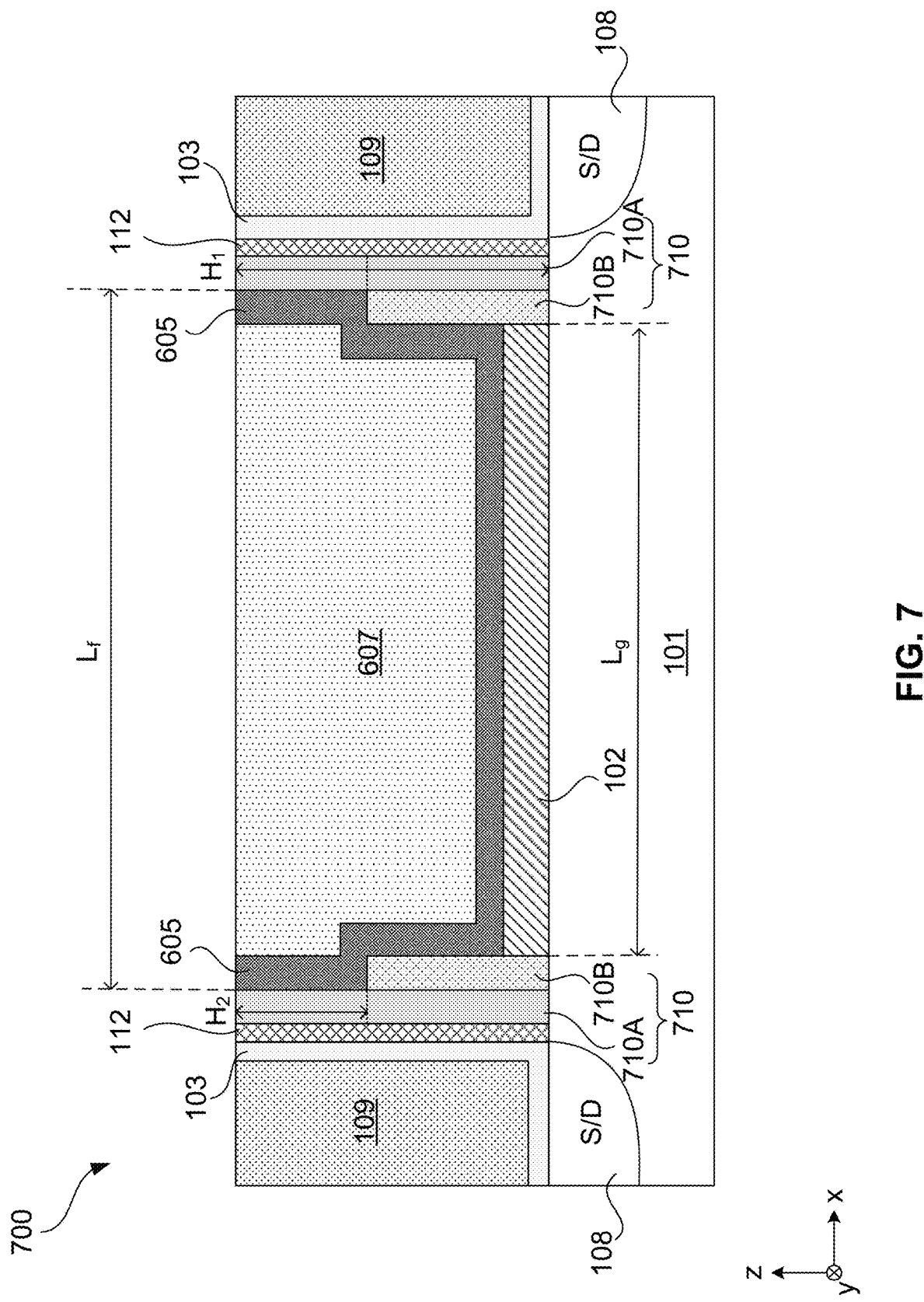
FIGS. 7 and 8 are cross-sectional views of semiconductor structures incorporating laterally etched multi-spacers, in accordance with some embodiments.
Figure 8:
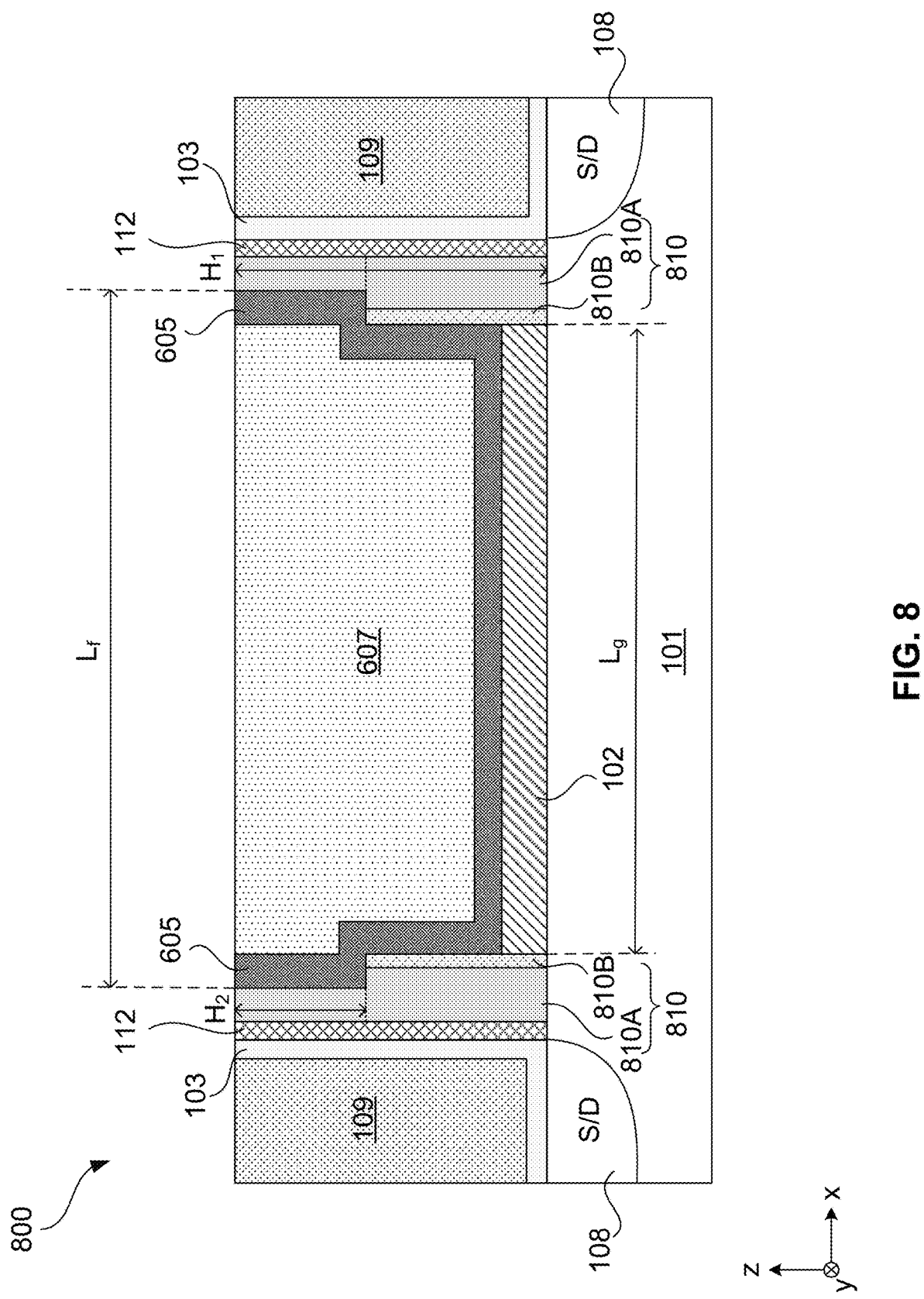

FIGS. 7 and 8 illustrate semiconductor devices having laterally etched multi-spacer structures, according to embodiments of the present disclosure. Laterally etched spacers 510 described above in FIGS. 5 and 6 can be a multi-spacer structure that include two or more sub-spacers. Semiconductor structures 700 and 800 can include substrate 101, liner layer 103, S/D 108, ILD 109, and spacers 112, as described above in FIG. 1B. These structures are not described in detail here for simplicity.

As shown in FIG. 7, spacers 710 can include a first sub-spacer 710A and a second sub-spacer 710B. Similar to height $H_1$ of spacer 510 described above in FIG. 5, first sub-spacer 710A can also have height $H_1$. First sub-spacer 710A is higher than the second sub-spacer 710B by a height that is similar to height $H_2$ described above in FIG. 5. Second sub-spacer 710B can be formed using a process similar to those described in FIG. 2. For example, second sub-spacer 710B can be formed by etching back an upper portion of a spacer until sidewalls of first sub-spacer 710A are partially exposed. The remaining portion of the spacer forms second sub-spacer 710B. First sub-spacer 710A can act as an etch stop layer for the etching process of second sub-spacer 710B.

As shown in FIG. 8, spacers 810 can include a first sub-spacer 810A and a second sub-spacer 810B. First and second sub-spacers 810A and 810B can be formed using a process similar to those described in FIG. 2. For example, first sub-spacer 810A can be similar to etched-back spacer 510. In some embodiments, the lower portion of spacers 810 can include a second sub-spacer 810B that has a height similar to lower portion 510B of etched-back spacer 510 described in FIG. 5. In some embodiments, second sub-spacer 810B can be formed in between first sub-spacer 810A and a gate stack that includes work function layer 605 and gate electrode 607. One or more lateral etching processes similar to lateral etching process 502 described in FIG. 5 can be performed to form second sub-spacer 810B and continues to be performed to form first sub-spacer 810A. For example, a sacrificial gate (not shown in FIG. 8) can be etched back in a vertical direction (e.g., z direction) to partially expose a sidewall of an original second sub-spacer that has a height similar to that of first sub-spacer 810A. A first lateral (e.g., x direction) etching process is performed to form second sub-spacer 810B through the partially exposed sidewall of the original second sub-spacer and partially expose a sidewall of the first sub-spacer 810A. A second lateral etching process is performed on first sub-spacer 810A through the partially exposed sidewall of the first sub-spacer 810A to reduce a width of an upper portion of the first sub-spacer 810A. In some embodiments, first and second sub-spacers 810A and 810B are formed using the same material. In some embodiments, first and second sub-spacers 810A and 810B are formed using different materials. For example, first sub-spacer 810A can be formed using silicon nitride and second sub-spacer 810B can be formed using silicon oxide. Accordingly, the first and second lateral etching processes can be the same or different, depending on the materials that form first and second sub-spacers 810A and 810B. In some embodiments, the selection of the first and second lateral etching processes can depend on various factors, such as spacer thickness, spacer height, spacer separation, and any other suitable factors. In some embodiments, the first lateral etching process can be a wet chemical etching process and the second lateral etching process can be a plasma etching process. After the one or more lateral etching processes, the sacrificial gate can be removed and replaced by metal gate electrode 607. An optional work function layer 605 can be deposited on gate dielectric layer 102 and the first and second sub-spacers 810A and 810B. As shown in FIG. 8, sidewalls and top surfaces of second sub-spacer 810B are in physical contact with work function layer 605 of the gate stack. In some embodiments, work function layer 605 is optional and gate electrode 607 is directly deposited onto gate dielectric layer 102 and in physical contact with first and second sub-spacers 810A and 810B.

Various embodiments in accordance with this disclosure provide methods for forming laterally etched spacers for gate structures of transistor devices. The spacers can be formed by etching back a polysilicon sacrificial gate structure and laterally etching the exposed portions of the spacers. The sacrificial gate structure is removed and replaced by a metal gate electrode. The laterally etched spacers can include an upper portion having a first width and a lower portion having a second width that is greater than the first width. The gate electrode formed between opposing laterally etched spacers can have variable width, such as a wider upper portion that is in physical contact with subsequently formed gate contacts and a narrower lower portion that is formed over a channel region of the transistor device.

In some embodiments, a semiconductor device includes a substrate and a pair of spacers on the substrate. Each spacer of the pair of spacers includes an upper portion having a first width and a lower portion under the upper portion and having a second width different from the first width. The semiconductor device further includes a gate structure between the pair of spacers. The gate structure has an upper gate length and a lower gate length that is different from the upper gate length.

In some embodiments, a method includes depositing a gate dielectric layer on a substrate and depositing a sacrificial gate on the gate dielectric layer. The method also includes forming first and second spacers on the substrate. The first and second sidewalls of the respective first and second spacers extend in a vertical direction and are in physical contact with the gate dielectric layer and the sacrificial gate. The method further includes etching back the sacrificial gate to form an etched-back sacrificial gate and to partially expose the first and second sidewalls. The method also includes performing an etching process on the partially exposed first and second sidewalls to respectively form etched-back first and second spacers. The etching process etches the first and second spacers in a lateral direction that is substantially perpendicular to the vertical direction. The method also includes removing the etched-back sacrificial gate and depositing a gate electrode on the gate dielectric layer and in physical contact with the etched-back first and second spacers.

In some embodiments, a method includes depositing a gate dielectric layer on a fin and depositing a sacrificial gate on the gate dielectric layer. The method also includes forming a spacer on the fin, the spacer including a first sub-spacer and a second sub-spacer in physical contact with the first sub-spacer and the sacrificial gate. The method further includes etching back a portion of the sacrificial gate such that a sidewall of the second sub-spacer is partially exposed and performing a first etching process. The first etching process includes laterally etching the second sub-spacer through the partially exposed sidewall of the second sub-spacer. The method also includes performing a second etching process. The second etching process includes laterally etching the first sub-spacer through the partially exposed sidewall of the first sub-spacer. The method further includes removing the sacrificial gate and exposing the gate dielectric layer and depositing a gate electrode on the gate dielectric layer. The gate electrode is in physical contact with the first and second sub-spacers.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
    forming a fin on a semiconductor substrate, the fin comprising a source/drain region;
    depositing a gate dielectric layer on the fin;
    depositing a sacrificial gate on the gate dielectric layer;
    forming a first spacer on the fin, wherein the first spacer comprises:
        a first sub-spacer; and
        a second sub-spacer in contact with the first sub-spacer and the sacrificial gate;
    forming, on the fin, a second spacer of uniform width in direct contact with a liner formed on sidewalls of an interlayer dielectric (ILD);
    etching back a portion of the sacrificial gate such that a sidewall of the second sub-spacer is partially exposed;
    performing a first etching process, comprising laterally etching the second sub-spacer through the partially exposed sidewall of the second sub-spacer;
    performing a second etching process, comprising laterally etching the first sub-spacer through the partially exposed sidewall of the first sub-spacer;
    removing the sacrificial gate to expose the gate dielectric layer; and
    depositing a gate electrode on the gate dielectric layer, wherein the gate electrode is in contact with the first and second sub-spacers.

2. The method of claim 1, wherein the first and second etching processes comprise a wet chemical etching process using a hydrofluoric acid based etchant.

3. The method of claim 1, wherein the first and second etching processes comprise a plasma etching process using hydrofluoric and carbon tetrafluoride precursors.

4. The method of claim 1, wherein the first and second etching processes are different.

5. The method of claim 1, wherein etching back the portion of the sacrificial gate comprises exposing between about 30% and about 50% of the sidewall of the second sub-spacer.

6. A method, comprising:
    forming a fin on a substrate;
    depositing a first gate over the fin;
    forming a first spacer in contact with the first gate, wherein the first spacer comprises:
        a first sub-spacer comprising a first sidewall and having a first height; and
        a second sub-spacer comprising a second sidewall and having a second height,
    wherein the second sub-spacer is in contact with the first sidewall;
    forming, on the fin, a second spacer in direct contact with a liner formed on sidewalls of an interlayer dielectric (ILD), the second spacer having a uniform height;
    recessing the first gate to partially expose the second sidewall;
    performing a first etching process on the partially exposed second sidewall to form a horizontal surface of the second sub-spacer and to partially expose the first sidewall;
    performing a second etching process on the partially exposed first sidewall to form a horizontal surface of the first sub-spacer and to form a third sidewall of the first sub-spacer;
    removing the first gate; and
    depositing a second gate in contact with the second and third sidewalls and the horizontal surfaces of the first and second sub-spacers.

7. The method of claim 6, wherein the first etching process comprises a wet chemical etching process using a hydrofluoric acid based etchant.

8. The method of claim 6, wherein the first etching process comprises a plasma etching process using hydrofluoric and carbon tetrafluoride precursors.

9. The method of claim 6, wherein the horizontal surfaces of the first and second sub-spacers are substantially coplanar.

10. The method of claim 6, wherein recessing the first gate comprises exposing between about 30% and about 50% of the second sidewall.

11. A method, comprising:
    depositing a gate dielectric layer on a substrate;
    depositing a first gate on the gate dielectric layer;
    forming a first spacer in contact with the substrate, wherein the first spacer comprises:
        a first sub-spacer comprising a first sidewall; and
        a second sub-spacer comprising a second sidewall, wherein the second sub-spacer is in contact with the first sidewall;

forming a second spacer in contact with the substrate, the second spacer in direct contact with a liner formed on sidewalls of an interlayer dielectric (ILD) and having vertical sidewalls;

recessing the first gate to expose a top portion of the second sidewall;

performing a first etching process on the top portion of the second sidewall to form a horizontal surface of the second sub-spacer and to expose a top portion of the first sidewall;

performing a second etching process on the top portion of the first sidewall to form a third sidewall of the first sub-spacer;

removing the first gate; and depositing a second gate in contact with a bottom portion of the second sidewall, the horizontal surface of the second sub-spacer, and the third sidewall.

12. The method of claim 11, wherein the first etching process comprises a wet chemical etching process using a hydrofluoric acid based etchant.

13. The method of claim 11, wherein the first etching process comprises a plasma etching process using hydrofluoric and carbon tetrafluoride precursors.

14. The method of claim 11, wherein performing the second etching process comprises forming a horizontal surface of the first sub-spacer.

15. The method of claim 14, wherein the horizontal surfaces of the first and second sub-spacers are substantially coplanar.

16. The method of claim 11, wherein a height of the top portion of the second sidewall is between about 30% and about 50% of a total height of the second sidewall.

17. The method of claim 11, wherein the second etching process comprises a wet chemical etching process using ammonium hydroxide and hydrogen dioxide.

18. The method of claim 11, wherein a height of the third sidewall is between about 30% and about 50% of a total height of the first sidewall.

19. The method of claim 11, wherein the first and second sub-spacers comprise silicon nitride and silicon oxide, respectively.

20. The method of claim 11, wherein forming the second spacer comprises forming the second spacer having a substantially uniform width.

* * * * *